(12) United States Patent
Choi et al.

(10) Patent No.: US 10,119,994 B2
(45) Date of Patent: Nov. 6, 2018

(54) PROBE CARD HAVING LEAD PART FOR REMOVING EXCESSIVE SOLDER

(71) Applicant: SAMSUNG ELECTRO-MECHANICS CO., LTD, Suwon-Si, Gyeonggi-Do (KR)

(72) Inventors: Yong Seok Choi, Suwon-Si (KR); Doo Yun Chung, Suwon-Si (KR); Dae Hyeong Lee, Suwon-Si (KR)

(73) Assignee: SEMCNS CO., LTD., Seongnam-Si, Gyeonggi-Do (KR)

( * ) Notice: Subject to any disclaimer, the term of this patent is extended or adjusted under 35 U.S.C. 154(b) by 14 days.

(21) Appl. No.: 14/934,803

(22) Filed: Nov. 6, 2015

(65) Prior Publication Data
US 2016/0178668 A1  Jun. 23, 2016

(30) Foreign Application Priority Data

Dec. 23, 2014 (KR) .................. 10-2014-0186947

(51) Int. Cl.
*G01R 1/073* (2006.01)
*G01R 3/00* (2006.01)

(52) U.S. Cl.
CPC ............ *G01R 1/07307* (2013.01); *G01R 3/00* (2013.01)

(58) Field of Classification Search
CPC ............ G01R 1/07307; G01R 1/07314; G01R 1/07364; G01R 1/073792; G01R 3/00; G01R 1/06727; G01R 1/07342; G01R 1/073; G01R 1/06711; G01R 1/07357; G01R 1/06716; G01R 1/06744;
(Continued)

(56) References Cited

U.S. PATENT DOCUMENTS

2002/0027444 A1* 3/2002 Jones ................. G01R 1/06744
324/756.04
2007/0296435 A1* 12/2007 Eldridge ............ G01R 1/06711
324/754.03
(Continued)

FOREIGN PATENT DOCUMENTS

JP          9-293957       * 11/1997
KR      10-0716434 B1     5/2007
(Continued)

OTHER PUBLICATIONS

English Machine Translation of Nakamura JP 9-293957.*
Korean Office Action issued in Korean Application No. 10-2014-0186947 dated Dec. 10, 2015, with English Translation.

*Primary Examiner* — Tung X Nguyen
*Assistant Examiner* — Lee Rodak
(74) *Attorney, Agent, or Firm* — McDermott Will & Emery LLP

(57) ABSTRACT

A probe card includes a ceramic substrate; an electrode connection part connecting an electrode pad and a via pad which are provided on one surface of the ceramic substrate; a bonding pad provided on an upper surface of the electrode pad and disposed inwardly of an edge of the electrode pad; and a probe bonded to an upper surface of the bonding pad by a solder layer between the bonding pad and the probe. The bonding pad includes a lead part protruding from a side surface of the bonding pad. As a result, overflowed solder at the time of attaching the probe onto the upper surface of the bonding pad may be dispersed to the lead part.

21 Claims, 3 Drawing Sheets

(58) Field of Classification Search
CPC ............ G01R 1/06755; G01R 1/07378; G01R
31/2886; G01R 31/2889; G01R 31/04;
G01R 31/0408; G01R 31/0483; G01R
31/067; G01R 31/06738; G01R 31/06761;
G01R 31/07; G01R 31/0735; G01R
31/2808; G01R 31/2884; G01R 31/3291;
G01R 31/3025; G01R 31/02; G01R
31/26; G01R 31/289; G01R 31/2891;
H01L 2924/00; H01L 2924/00014; H01L
2924/10253; H01L 2924/01078; H01L
2924/01079; H01L 2924/01006; H01L
2924/01013; H01L 2924/01033; H01L
2924/014; H01L 2924/3011; H01L
2224/45144; H01L 2224/48091; H01L
2224/45015; H01L 2224/48227; H01L
2224/13099; H01L 2224/32225; H01L
2224/45124; H01L 2224/73265
USPC ............... 324/756.03, 754.07, 754.01–754.2,
324/755.01–755.11, 756.01–756.07,
324/762.01–762.09
See application file for complete search history.

(56) References Cited

U.S. PATENT DOCUMENTS

| | | | |
|---|---|---|---|
| 2008/0074131 A1* | 3/2008 | Kim | G01R 1/06727 324/754.14 |
| 2008/0174328 A1* | 7/2008 | Miller | G01R 1/07342 324/755.03 |
| 2008/0290139 A1* | 11/2008 | Kim | G01R 1/06727 228/125 |
| 2011/0169517 A1* | 7/2011 | Kim | G01R 1/06744 324/756.03 |
| 2011/0233545 A1 | 9/2011 | Shin et al. | |
| 2013/0088251 A1 | 4/2013 | Choi et al. | |
| 2013/0162278 A1* | 6/2013 | Chung | B23K 1/0008 324/755.01 |

FOREIGN PATENT DOCUMENTS

| | | |
|---|---|---|
| KR | 10-2009-0052426 A | 5/2009 |
| KR | 10-2010-0137240 A | 12/2010 |
| KR | 10-2011-0108729 A | 10/2011 |
| KR | 10-2013-0037451 A | 4/2013 |
| WO | 2007/119930 A1 | 10/2007 |

* cited by examiner

PROBE CARD HAVING LEAD PART FOR REMOVING EXCESSIVE SOLDER

CROSS-REFERENCE TO RELATED APPLICATION

This application claims benefit of priority to Korean Patent Application No. 10-2014-0186947 filed on Dec. 23, 2014, with the Korean Intellectual Property Office, the disclosure of which is incorporated herein by reference.

BACKGROUND

The present disclosure relates to a probe card in which a solder layer and a probe are easily separated from each other.

In accordance with the recent development of integrated technology for semiconductor circuits, the size of such circuits has been gradually miniaturized, and as a result, an inspection apparatus for a semiconductor chip has been required to have a high degree of precision.

Integrated circuit chips formed on a semiconductor wafer through a wafer assembly process may be classified into fair quality products and defective products by an electrical die sorting (EDS) process performed while integrated circuit chips remain in a wafer state.

For the EDS process, an inspection apparatus, generally including a tester, for generating an inspection signal and determining an inspection result, a probe station, for loading and unloading semiconductor wafers, and a probe card, for electrically connecting the semiconductor wafer to the tester, has commonly been used.

The probe card, in which a probe is bonded to a ceramic substrate manufactured by stacking ceramic green sheets on which circuit patterns, electrode pad via electrodes, and the like are generally formed prior to the stacked ceramic green sheets being sintered, is mainly used.

The probe attached to the ceramic substrate may need to be realigned, after the electrode pads and the probe are attached to the substrate. In this case, correcting a position of the probe includes removing the probe after a solder is melted by heating and re-bonding, and physically moving the probe without heating the solder.

Physical pin alignment is generally determined after taking the convenience and economics of a task into account.

Here, in a case in which solder is excessively applied to the electrode pad, since coupling force between the solder and the probe is stronger than coupling force between the electrode pad and the ceramic substrate, a bonding pad may be disadvantageously separated from the ceramic substrate.

SUMMARY

According to an aspect of the present disclosure, a probe card includes a ceramic substrate, an electrode pad formed on one surface of the ceramic substrate, and a bonding pad formed on an upper surface of the electrode pad and formed inwardly of an edge of the electrode pad sequentially stacked. The bonding pad includes a lead part dispersing overflowed solder when the bonding pad is bonded to a probe through the melting of a solder layer formed on an upper surface of the bonding pad.

According to an aspect of the present disclosure, a probe card may include: a ceramic substrate; an electrode connection part connecting an electrode pad and a via pad which are provided on one surface of the ceramic substrate; a bonding pad provided on an upper surface of the electrode pad and disposed inwardly of an edge of the electrode pad; and a probe bonded to an upper surface of the bonding pad by a solder layer between the bonding pad and the probe. The bonding pad may include a lead part protruding from a side surface of the bonding pad.

The bonding pad may be formed to protrude in a direction of the electrode connection part or in an opposite direction, and the probe card may further include the lead part dispersing a solder in a case in which the solder is applied excessively.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
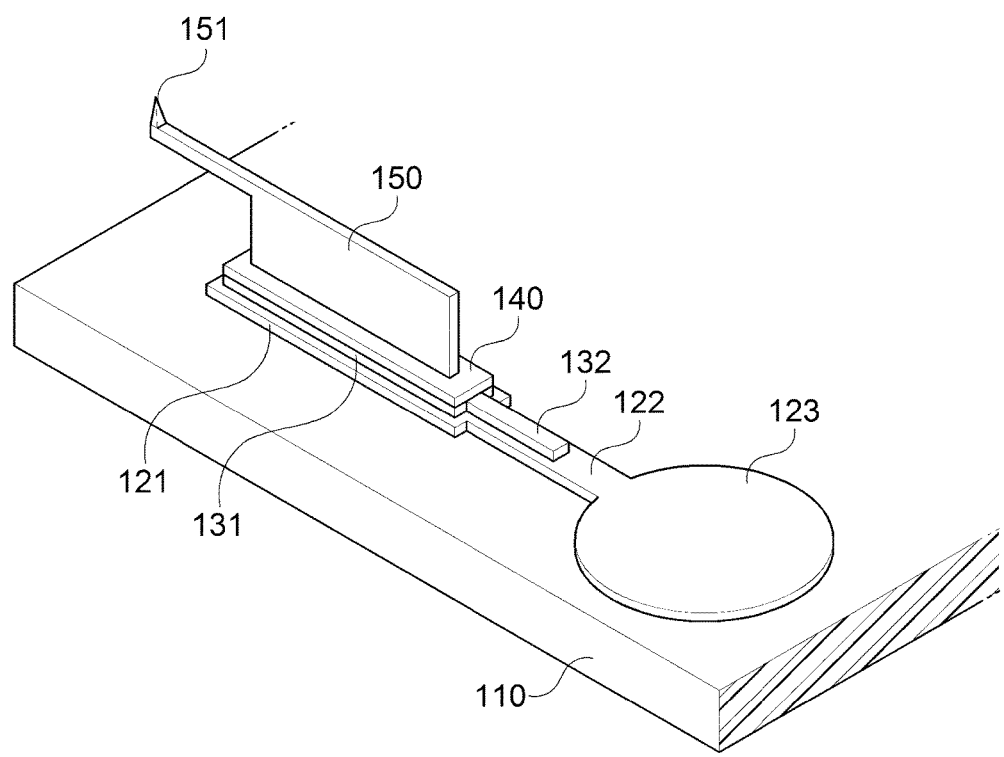
FIG. 1 is a perspective view of a probe card according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

Figure 2:
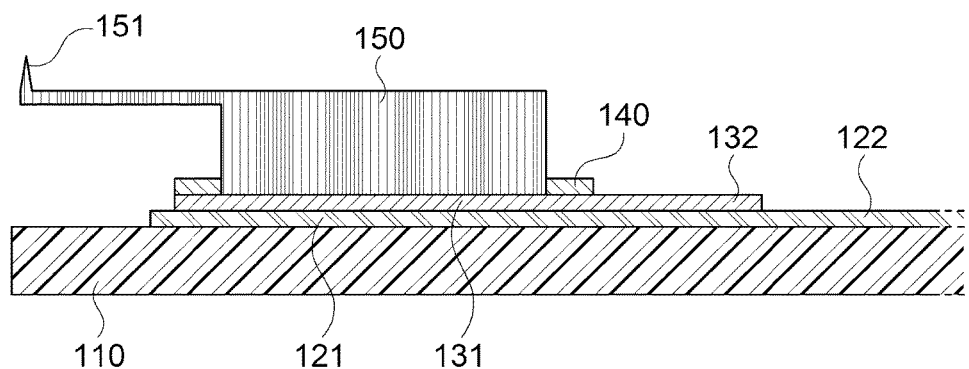
FIG. 2 is a cross-sectional view of the probe card of FIG. 1.
Figure 3:
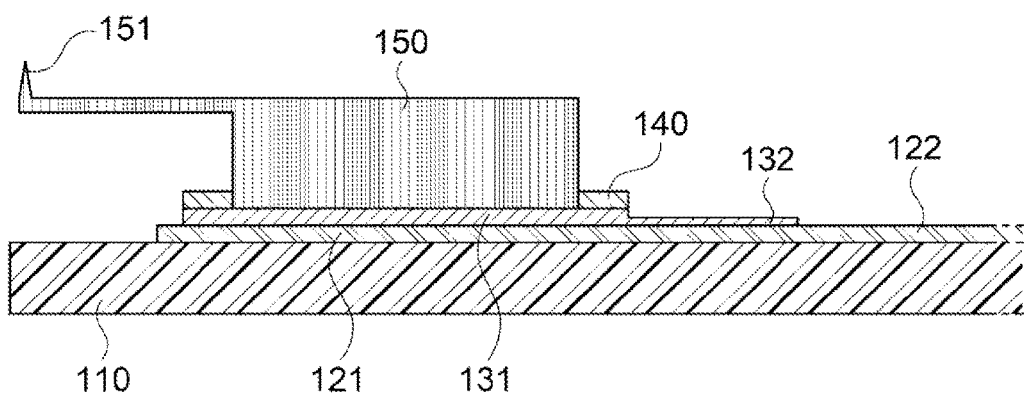
FIG. 3 is a cross-sectional view of a probe card according to another exemplary embodiment in the present disclosure.
Figure 4:
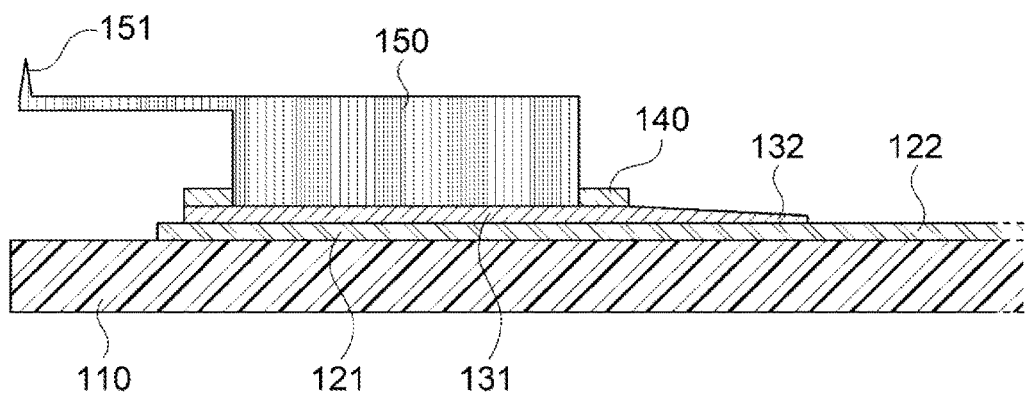
FIG. 4 is a cross-sectional view of a probe card according to another exemplary embodiment in the present disclosure.

FIG. 1 is a perspective view of a probe card according to an exemplary embodiment in the present disclosure, FIG. 2 is a cross-sectional view of the probe card of FIG. 1, FIG. 3 is a cross-sectional view of a probe card according to another exemplary embodiment in the present disclosure, and FIG. 4 is a cross-sectional view of a probe card, according to another exemplary embodiment in the present disclosure.

As illustrated, a probe card 100 according to the present disclosure may include a ceramic substrate 110, an electrode pad 121, a via pad 123, and an electrode connection part 122 connecting the electrode pad 121 and the via pad 123 formed on the ceramic substrate to each other, and a bonding pad 131 may be formed on an upper surface of the electrode pad 121.

The ceramic substrate 110 may be manufactured by stacking a plurality of ceramic green sheets and sintering the stacked ceramic green sheets, and may be usefully employed as a thin film substrate having excellent hardness due to being formed of ceramic. A via connecting a wire layer to interlayer insulating layers is formed in the ceramic green sheets of the ceramic substrate 110, such that the ceramic green sheets may be electrically connected to each other.

Only upper end surfaces of the electrode pad, the via pad, and the electrode connection part may be exposed to an upper surface of the ceramic substrate, and the remainder of portions thereof may be embedded in the ceramic substrate.

The ceramic substrate 110 may be formed of high temperature co-fired ceramic (HTCC) or low temperature co-fired ceramic (LTCC).

In general, the low temperature co-fired ceramic (LTCC) may be fired together with a metal electrode at a temperature lower than the high temperature co-fired ceramic (HTCC) and has a low coefficient of thermal expansion (CTE).

The electrode pad 121 may be formed on one surface of the ceramic substrate, the probe 150 may be coupled to the electrode pad 121 so as to be physically and electrically connected to the electrode pad 121, and an electric signal may be transferred to the probe 150 by inspection apparatuses (not shown) formed on the other surface of the ceramic substrate.

The probe 150, a component transferring the electric signal to a product to be inspected, may have a cantilever shape and include a probe tip 151 having one end of a bonding part, bonded to the bonding pad 131 of the ceramic substrate 110 so as to be electrically connected to the bonding pad, and the other end of the bonding part in contact with the product to be inspected. According to the present disclosure, although the probe tip 151 has the cantilever form, the form of the probe tip 151 is not limited thereto and may be modified to have various shapes such as a linear shape which may be vertically bonded, and the like.

Meanwhile, the bonding pad 131 may be formed on the upper surface of the electrode pad 121 and the probe 150 may be bonded to an upper surface of the bonding pad 131. In this case, the bonding pad 131 maybe formed inwardly of an edge of the electrode pad 121 to support the probe 150 when the bonding pad 131 is coupled to the probe 150 through the melting of a solder layer 140 formed on the upper surface of the bonding pad 131.

The electrode pad 121 is formed to be wider than the bonding pad 131, and here, the bonding pad 131 stacked on the upper surface of the electrode pad 121 is formed to be narrow, such that the bonding pad 131 maybe formed inwardly of the edge of the electrode pad 121. Thus, bonding force between the electrode pad 121 and the ceramic substrate may be further increased.

The electrode pad 121 may be formed of a conductive material. Specifically, the electrode pad 121 may be formed of at least one selected from the group consisting of silver (Ag), gold (Au), palladium (Pd), platinum (Pt), rhodium (Rh), copper (Cu), titanium (Ti), tungsten (W), molybdenum (Mo), nickel (Ni), and alloys thereof. However, a material of the electrode pad is not limited thereto.

In addition, the bonding pad 131 may be bonded to the center of the electrode pad 121. Although stress is formed between the electrode pad 121 and the ceramic substrate when force is applied to the probe 150 in order to physically separate the probe 150 from the bonding pad 131, this stress may be lower than stress between the bonding pad 131 and the probe 150, thereby preventing the electrode pad 121 from being delaminated from the ceramic substrate 110.

The solder layer 140 may be formed of a metal material having a melting point lower than that of the bonding pad 131 and the electrode pad 121. Even though the solder layer 140 is melted by heating the solder layer 140, the bonding pad 131 and the electrode pad 121 may not be melted and may still form a supporting region in a subsequent process of separating and re-disposing the probe 150. The bonding pad 131 may have a form in which nickel is plated on a Ni or Cu seed layer and may be maintained in a solid state at the time of melting the solder layer because the bonding pad 131 has a higher melting point than the solder layer.

In this case, a soldering process of melting the solder layer 140 may use equipment known in the art, capable of applying heat. A soldering apparatus, using a laser, radio pulses, or thermal compression may be a unit capable of applying heat to the solder layer 140.

The bonding pad 131 may further include a lead part 132 protruding from a side surface thereof. The lead part 132 may protrude from one side of the bonding pad 131 so as to be outside of a region of the bonding pad 131. In this case, the lead part 132 may be extended in a direction of the electrode connection part 122 connecting the electrode pad 121 and the via pad 123 to each other.

The bonding pad 131 may serve to support the solder layer 140 formed on the bonding pad 131 and to control a flow of a solder when the solder layer 140 connecting the probe 150 to the bonding pad 131 is melted. That is, in a case in which a moderate amount of solder is used to form the solder layer 140, the bonding pad 131 may fix the probe 150 while being present in the region of the bonding pad 131.

In a case in which the solder layer 140 is excessively applied to the bonding pad 131, the lead part 132 may serve to prevent a problem in which the electrode pad 121 is separated from the ceramic substrate at the time of correcting the probe 150 because coupling force between the probe 150 and the solder layer 140, the bonding pad 131, and the electrode pad 121 may be increased.

That is, in the case in which the solder layer is excessively formed, since the lead part 132 may become a path through which the melted solder flows to disperse an excessive amount of solder, it may reduce bonding force between the probe 150 and the bonding pad 131.

Meanwhile, as a pattern width or a pitch interval of a wafer or a printed circuit board is currently miniaturized, the electrode pad and the bonding pad of the probe card may also be miniaturized, such that a heater may be easily disposed at the time of correcting a position of the probe after separating the probe, whereby process efficiency may be increased.

When the lead part 132 is heated, heat may be transferred to the bonding pad 131 in contact with the lead part 132 and the heat transferred to the bonding pad 131 may be re-transferred to the solder layer 140. In this case, only the solder layer 140 having a relatively low melting point may be melted, and the bonding pad 131 and the electrode pad 121 may be maintained in a solidified state.

One or more lead parts 132 may be formed on the side surface of the bonding pad 131. However, since the bonding pad 131 is formed to be reasonably long in a length direction and to be narrow in a width direction, the lead part 132 may protrude in the length direction. Specifically, the lead part 132 may protrude from a region within the bonding pad 131 in a direction of the electrode connection part 122 and/or an opposite direction.

As such, even when the excessively applied solder layer is melted, since the melted solder is dispersed to the lead part 132 by the lead part 132 protruding in two directions, the solder may be adjusted to be a moderate amount of solder on the upper surface of the bonding pad 131.

Meanwhile, as illustrated in FIG. 3, the lead part 132 may form a step with the bonding pad 131. The lead part 132 may be formed to be extended from the bonding pad 131 in the direction of the electrode connection part 122 to form the protruded lead part 132, wherein the lead part 132 may be formed to be lower than the bonding pad 131 due to the step.

In the case in which the lead part 132 is formed to be lower than the bonding pad 131, the lead part 132 may form a path through which the solder may flow when the solder layer 140 formed on the upper surface of the bonding pad 131 is melted. This may be effective to guide overflowed solder in the case in which the solder layer is excessively applied.

Alternatively, as shown in FIG. 4, the lead part 132 may be formed to be inclined. That is, the lead part 132 may be formed to be downwardly inclined from a portion extended from the bonding pad 131, thereby guiding an overflow of the solder layer 140.

Figure 5:
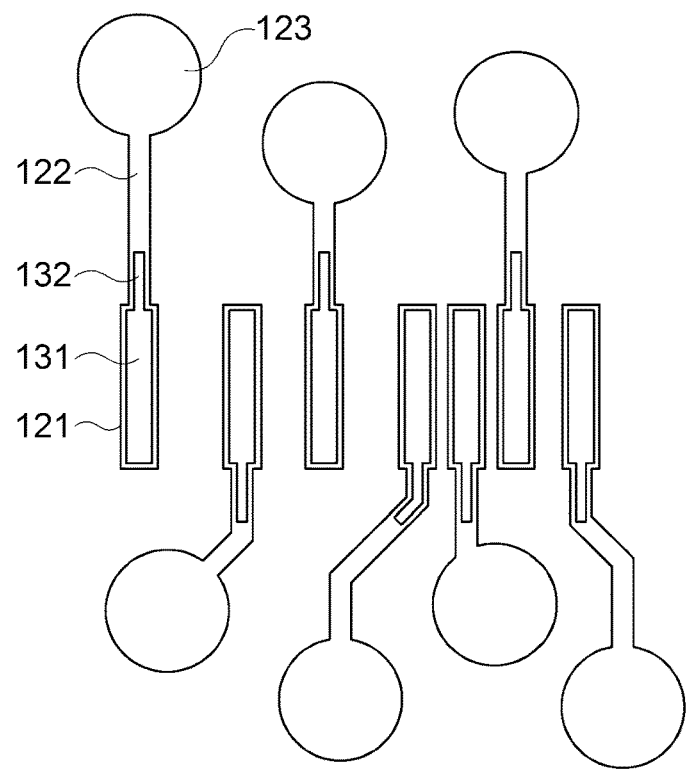
FIG. 5 is a plan view of an electrode pad and a bonding pad stacked on an upper surface of a ceramic substrate.
Figure 6:
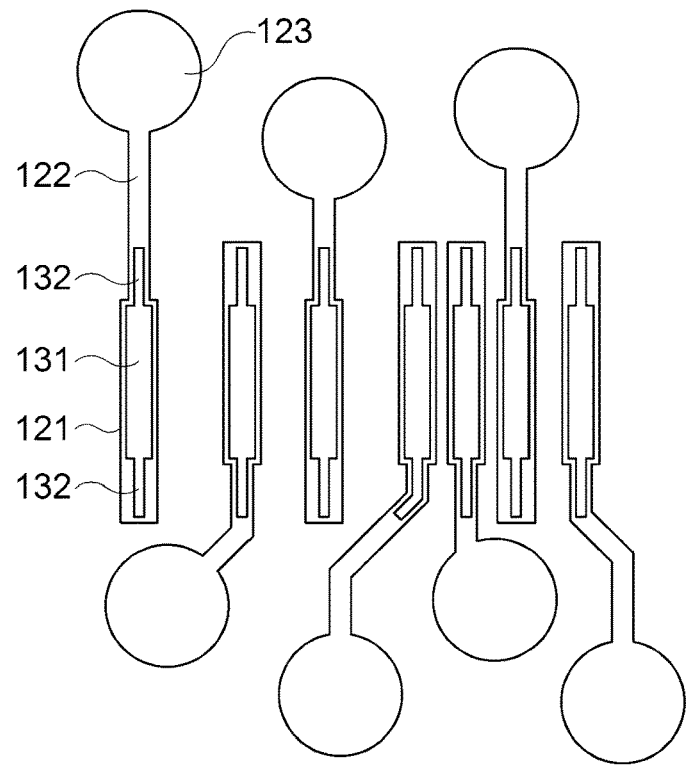
FIG. 6 is a plan view of a modified example of the electrode pad and the bonding pad of FIG. 5.

FIG. 5 is a plan view illustrating the electrode pad 121 and the bonding pad 131 stacked on the upper surface of the ceramic substrate and FIG. 6 is a plan view illustrating a modified example of the electrode pad and the bonding pad 131 of FIG. 5.

FIG. 5 illustrates only the electrode pad 121, the via pad 123, and the electrode connection part 122 connecting the electrode pad 121 and the via pad 123 to each other formed on the ceramic substrate, the bonding pad 131 formed on the upper surface of the electrode pad 121 and formed in the inner side of the edge of the electrode pad 121, and the lead part 132 formed by the bonding pad 131 protruding in the direction of the electrode connection part 122. The lead part 132 may also include a region protruding in a direction opposite to that of the electrode connection part 122.

In addition, the lead part 132 may have the step formed with the bonding pad 131. When the solder layer applied to the upper surface of the bonding pad 131 is coupled to the probe 150, the lead part 132 may form a path through which the solder flows in the case in which the melted solder is overflowed.

In addition, the lead part 132 may be formed to be inclined, thereby allowing the solder to be easily dispersed. The melted solder may be present within the region of the bonding pad 131 due to high viscosity and surface tension. In this case, since the lead part 132 is formed of the same material as the bonding pad 131, the lead part 132 may become a region through which the melted solder may be easily moved.

Next, a method for manufacturing a probe card will be described.

A ceramic substrate 110 may be formed by stacking and sintering a plurality of ceramic layers and may be formed by forming a circuit pattern, a via, and the like in the ceramic layers.

The via may form a path for transferring electric signals of the probe card and may be connected to a via pad 123 formed on a surface of the ceramic substrate 110, and the via pad 123 may be connected to an electrode pad 121 through an electrode connection part 122. The electrode pad 121 may be a medium transferring the electric signal to a probe 150 connected to an upper portion of the electrode pad 121.

The electrode pad 121 may be formed by using a printing method using a squeeze blade and a mask, or by a known process such as an electroplating, electroless plating, or the like. The electrode pad 121 may be formed to be wider than a bonding pad 131 formed to be stacked on an upper surface of the electrode pad 121 to increase adhesion with the ceramic substrate and to prevent the electrode pad 121 from being delaminated from the ceramic substrate at the time of separating the probe 150.

Next, the bonding pad 131 supporting the probe may be formed on the electrode pad 121. The bonding pad 131 may be formed inwardly of an upper portion of the electrode pad 121, that is, in an edge of the electrode pad 121, and a lead part 132 protruding from the electrode pad 121 maybe simultaneously formed on a side surface of the bonding pad 131. The lead part 132 may be extended in a direction of the electrode connection part 122, and may form a step or an incline, if necessary.

To form the bonding pad 131, a photoresist or a dry film is applied on the electrode pad 121 and the ceramic substrate 110, a region of an upper surface of the electrode pad 121 on which the bonding pad 131 is to be formed may be exposed, and only the exposed region may be developed.

Next, the bonding pad 131 may be formed on the upper surface of the electrode pad 121 by plating the region in which the photoresist or the dry film is developed. The lead part 132 may also be formed by using the same method as that described above.

Next, a planarization process may be performed, and surface irregularities may be removed by a polishing process to complete the bonding pad 131. Here, a solder layer may be applied to an upper surface of the bonding pad 131, wherein a method for applying the solder layer maybe the same as the method for forming the bonding pad 131.

Then, in a case in which the probe 150 is located on a center surface of the solder layer 140 and the solder layer 140 is heated by a heater, the solder layer 140 may be melted and the probe 150 may be physically and electrically bonded to the bonding pad 131. In the case in which the probe 150 and the bonding pad 131 are bonded to each other, the probe 150 and the ceramic substrate 110 may be fixed to each other by performing a curing process . Here, in a case in which the solder layer 140 is excessively applied, the solder may be moved to the lead part 132 formed on the side surface of the bonding pad 131 while the solder layer 140 is melted, such that a moderate amount of solder may be left on the upper surface of the bonding pad 131. The probe 150 may be easily separated by using physical force or the heater in order to realign the probe 150 of which a position is not accurately aligned, at an accurate position. Here, in the case in which the probe 150 is separated by using the heater, when the lead part 132 is heated, heat may be transferred to the bonding pad 131 and be transferred to the upper surface of the bonding pad 131. As a result, since the solder layer having a relatively low melting point is melted, a probe re-alignment process may be simplified.

As set forth above, according to exemplary embodiments in the present disclosure, in the probe card, since the bonding pad formed on the upper surface of the electrode pad includes the lead part formed on the upper surface of the electrode pad and protruding to be extended to the electrode connection part connected to the electrode pad, the solder overflowed at the time of attaching the probe to the upper surface of the bonding pad may be dispersed to the lead part.

In addition, since the heater may be attached to the lead part, a region open at the time of separating the probe and re-correcting the position of the probe, the soldering process may be easily performed.

While exemplary embodiments have been shown and described above, it will be apparent to those skilled in the art that modifications and variations could be made without departing from the scope of the present invention as defined by the appended claims.

What is claimed is:
1. A probe card comprising:
   a ceramic substrate;
   an electrode connection part connecting an electrode pad and a via pad which are provided on one surface of the ceramic substrate;

a bonding pad provided on an upper surface of the electrode pad and disposed inwardly of an edge of the electrode pad;

a probe bonded to an upper surface of the bonding pad via a solder layer between the bonding pad and the probe; and a lead part protruding, in a direction of the electrode connection part, from a side surface of the bonding pad and including a bar shape disposed on the electrode connection part, and wherein the lead part is formed of a same material as the bonding pad, and is disposed directly on the electrode connection part.

2. The probe card of claim 1, wherein the lead part and the bonding pad have a step therebetween.

3. The probe card of claim 1, wherein the lead part is inclined with reference to the one surface of the ceramic substrate.

4. The probe card of claim 1, wherein the solder layer is dispersed to the lead part when being melted.

5. The probe card of claim 1, wherein the electrode pad is formed of at least one selected from the group consisting of silver (Ag), gold (Au), palladium (Pd), platinum (Pt), rhodium (Rh), copper (Cu), titanium (Ti), tungsten (W), molybdenum (Mo), nickel (Ni), and alloys thereof.

6. The probe card of claim 1, wherein the bonding pad is prepared by plating a Ni or Cu seed layer with nickel.

7. The probe card of claim 1, wherein the ceramic substrate is a low temperature co-fired ceramic (LTCC) substrate.

8. The probe card of claim 1, wherein a width of the lead part is smaller than a width of the electrode connection part.

9. The probe card of claim 8, wherein the width of the electrode connection part is smaller than a width of the electrode pad and a width of the via pad.

10. The probe card of claim 1, wherein the lead part includes a portion, which is not covered by the solder layer, extending onto the electrode connection part.

11. The probe card of claim 1, wherein the electrode connection part has a thickness the same as that of the electrode pad.

12. A probe card comprising:

a ceramic substrate;

an electrode pad and a via pad connected to each other by an electrode connection part having a width smaller than those of the via pad and the electrode pad, the electrode connection part having a thickness the same as that of the electrode pad;

a bonding pad provided on the electrode pad and disposed inwardly of the electrode pad;

a probe bonded to the bonding pad via a solder layer between the bonding pad and the probe; and a lead part protruding from a side surface of the bonding pad and extending on the electrode connection part, the lead part having a width smaller than that of the electrode connection part, wherein the lead part is formed of a same material as the bonding pad.

13. The probe card of claim 12, wherein the lead part and the bonding pad have a step therebetween.

14. The probe card of claim 12, wherein the lead part is inclined with reference to a surface of the ceramic substrate.

15. The probe card of claim 12, wherein the solder layer is dispersed to the lead part when being melted.

16. The probe card of claim 12, wherein the electrode pad is formed of at least one selected from the group consisting of silver (Ag), gold (Au), palladium (Pd), platinum (Pt), rhodium (Rh), copper (Cu), titanium (Ti), tungsten (W), molybdenum (Mo), nickel (Ni), and alloys thereof.

17. The probe card of claim 12, wherein the bonding pad is prepared by plating a Ni or Cu seed layer with nickel.

18. The probe card of claim 12, wherein the ceramic substrate is a low temperature co-fired ceramic (LTCC) substrate.

19. The probe card of claim 12, wherein the lead part is disposed directly on the electrode connection part.

20. The probe card of claim 12, wherein the lead part includes a portion, which is not covered by the solder layer, extending onto the electrode connection part.

21. A probe card comprising: a ceramic substrate;

a first electrically conductive layer disposed on the ceramic substrate, and including an electrode pad, a via pad, and an electrode connection part connecting the electrode pad and the via pad to each other, the electrode connection part having a width smaller than those of the via pad and the electrode pad;

a second electrically conductive layer entirely, directly disposed on the first electrically conductive layer, and including a bonding pad and a lead part made of a same material, the lead part protruding from a side surface of the bonding pad, extending onto the electrode connection part, and having a width smaller than those of the electrode connection part and the bonding pad;

a solder layer disposed on the bonding pad; and a probe attached to the bonding pad through the solder layer.

\* \* \* \* \*